United States Patent
Nakabayashi

(10) Patent No.: US 7,330,030 B2
(45) Date of Patent: Feb. 12, 2008

(54) MAGNETIC RESONANCE IMAGING APPARATUS

(75) Inventor: Kazuto Nakabayashi, Nasushiobara (JP)

(73) Assignees: Kabushiki Kaisha Toshiba, Tokyo (JP); Toshiba Medical Systems Corporation, Otawara-shi, Tochigi (JP)

( * ) Notice: Subject to any disclaimer, the term of this patent is extended or adjusted under 35 U.S.C. 154(b) by 0 days.

(21) Appl. No.: 11/588,229

(22) Filed: Oct. 27, 2006

(65) Prior Publication Data

US 2007/0096739 A1 May 3, 2007

(30) Foreign Application Priority Data

Nov. 2, 2005 (JP) ............... 2005-319851

(51) Int. Cl.
*G01V 3/00* (2006.01)
(52) U.S. Cl. .................. 324/318; 324/309
(58) Field of Classification Search ........ 324/300–322; 600/407–445
See application file for complete search history.

(56) References Cited

U.S. PATENT DOCUMENTS

| | | | |
|---|---|---|---|
| 5,197,474 A | * | 3/1993 | Englund et al. ............ 600/415 |
| 5,490,508 A | * | 2/1996 | Kato ........................ 600/422 |
| 5,808,468 A | | 9/1998 | Bis et al. |
| 5,928,148 A | | 7/1999 | Wang et al. |
| 7,218,106 B2 | * | 5/2007 | Yasuhara et al. ........... 324/307 |

FOREIGN PATENT DOCUMENTS

| | | |
|---|---|---|
| JP | 3-94734 | 4/1991 |
| JP | 4-102443 | 4/1992 |
| JP | 2002-306444 | 10/2002 |
| JP | 2003-334177 | 11/2003 |

* cited by examiner

*Primary Examiner*—Brij Shrivastav
(74) *Attorney, Agent, or Firm*—Nixon & Vanderhye P.C.

(57) ABSTRACT

A magnetic resonance imaging apparatus includes a top plate on which an patient to be imaged is disposed, a plurality of positioning units that determines setting positions of RF coils detachable from the top plate in a plurality of different positions, and a detecting unit that detects the setting positions of the RF coils based on one of the positioning units that is used in order to determine the setting positions of the RF coils.

22 Claims, 3 Drawing Sheets

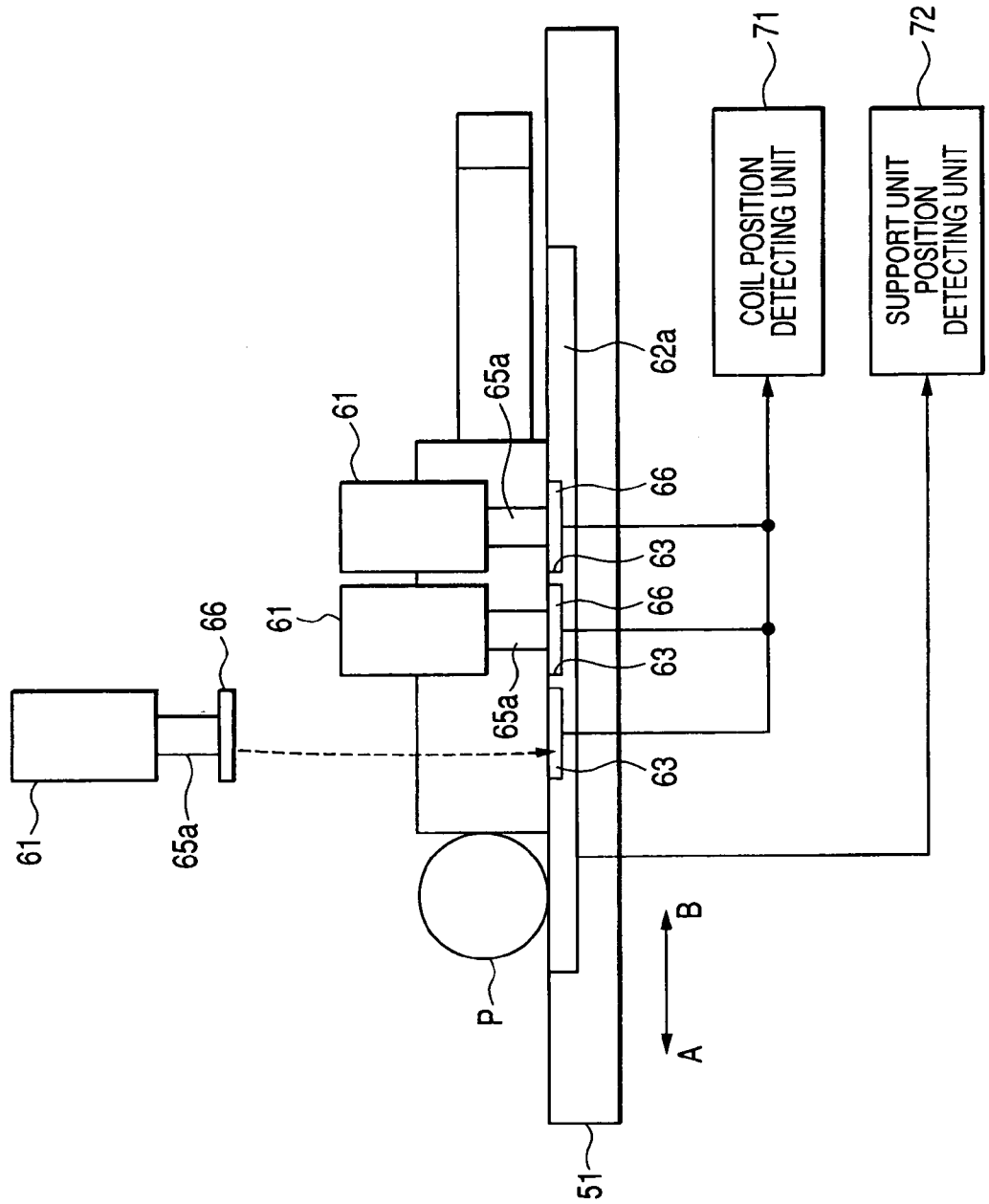

MAGNETIC RESONANCE IMAGING APPARATUS

CROSS-REFERENCE TO RELATED APPLICATIONS

This application is based upon and claims the benefit of priority from prior Japanese Patent Application No. 2005-319851, filed Nov. 2, 2005, the entire contents of which are incorporated herein by reference.

BACKGROUND OF THE INVENTION

1. Field of the Invention

The present invention relates to an improvement of an MRI (magnetic resonance imaging) apparatus which obtains an MR (magnetic resonance) image of an patient using a magnetic resonance phenomenon.

2. Description of the Related Art

In the MRI apparatus, a plurality of radio frequency coils (RF coils) are disposed on an abdominal region of the patient and images are captured while moving the patient.

In the case of capturing images using the above MRI apparatus, when all of MR signals output from the plurality of RF coils are used in a reconstructing process, there are problems in that it takes longer time to reconstruct and the number of images to be obtained is increased, which deteriorates the efficiency in the diagnosis.

In order to solve the above problems, it is preferable to select RF coils that are positioned in an imaging area, among RF coils to use only MR signals output from the selected RF coils in the reconstructing process. However, since the positions of the RF coils disposed in the upper abdominal region are variable, it is difficult to know the setting position of the RF coils in the MRI apparatus. Further, in order to previously specify the setting position, the setting is necessarily performed by an operator, which increases the burden of the operator.

The MRI apparatus that captures images by selectively using the plurality of RF coils is disclosed in JP-A-2003-334177.

BRIEF SUMMARY OF THE INVENTION

Considering the above conditions, it is required to automatically detect setting positions of the RF coils.

A magnetic resonance imaging apparatus according to a first aspect of this invention includes a top plate on which an patient to be imaged is disposed, a plurality of positioning units that determines setting positions of RF coils detachable from the top plate in a plurality of different positions, and a detecting unit that detects the setting positions of the RF coils based on one of the positioning units that is used in order to determine the setting positions of the RF coils.

A magnetic resonance imaging apparatus according to a second aspect of this invention includes a bed having a top plate on which an patient is disposed and sliding the top plate in a first direction so as to move the patient in a body axis direction, an applying unit that applies a gradient magnetic field and a RF pulse to the patient who is sent in a static magnetic field by the bed, at least one RF coil that detects a magnetic resonance signal radiated from the patient by applying the gradient magnetic field and the RF pulse, and a plurality of positioning units that determines setting positions of RF coils in a plurality of different positions.

A magnetic resonance imaging apparatus according to a third aspect of this invention includes a bed having a top plate on which an patient is disposed and sliding the top plate in a first direction so as to move the patient in a body axis direction, an applying unit that applies a gradient magnetic field and a RF pulse to the patient who is sent in a static magnetic field by the bed, at least one RF coil that detects a magnetic resonance signal radiated from the patient by applying the gradient magnetic field and the RF pulse, a plurality of positioning units that determines setting positions of RF coils in a plurality of different positions, and a detecting unit that detects the setting positions of the RF coils based on one of the positioning units that is used in order to determine the setting positions of the RF coils.

A method according to a fourth aspect of this invention detects setting positions of RF coils of a magnetic resonance imaging apparatus which includes a top plate on which an patient to be imaged is disposed and a plurality of positioning units that determines the setting positions of the RF coils detachable from the top plate in a plurality of different positions. The method includes identifying one of the plurality of positioning units that is used to determine the setting positions of the RF coils, and detecting the setting positions of the RF coils on the basis of the identified positioning unit.

Additional patients and advantageous of the invention will be set forth in the description which follows, and in part will be obvious from the description, or may be learned by practice of the invention. The patients and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3 is a configuration diagram showing a side part of FIG. 2.

DETAILED DESCRIPTION OF THE INVENTION

Embodiments of this invention will be described with reference to accompanying drawings.

Figure 1:
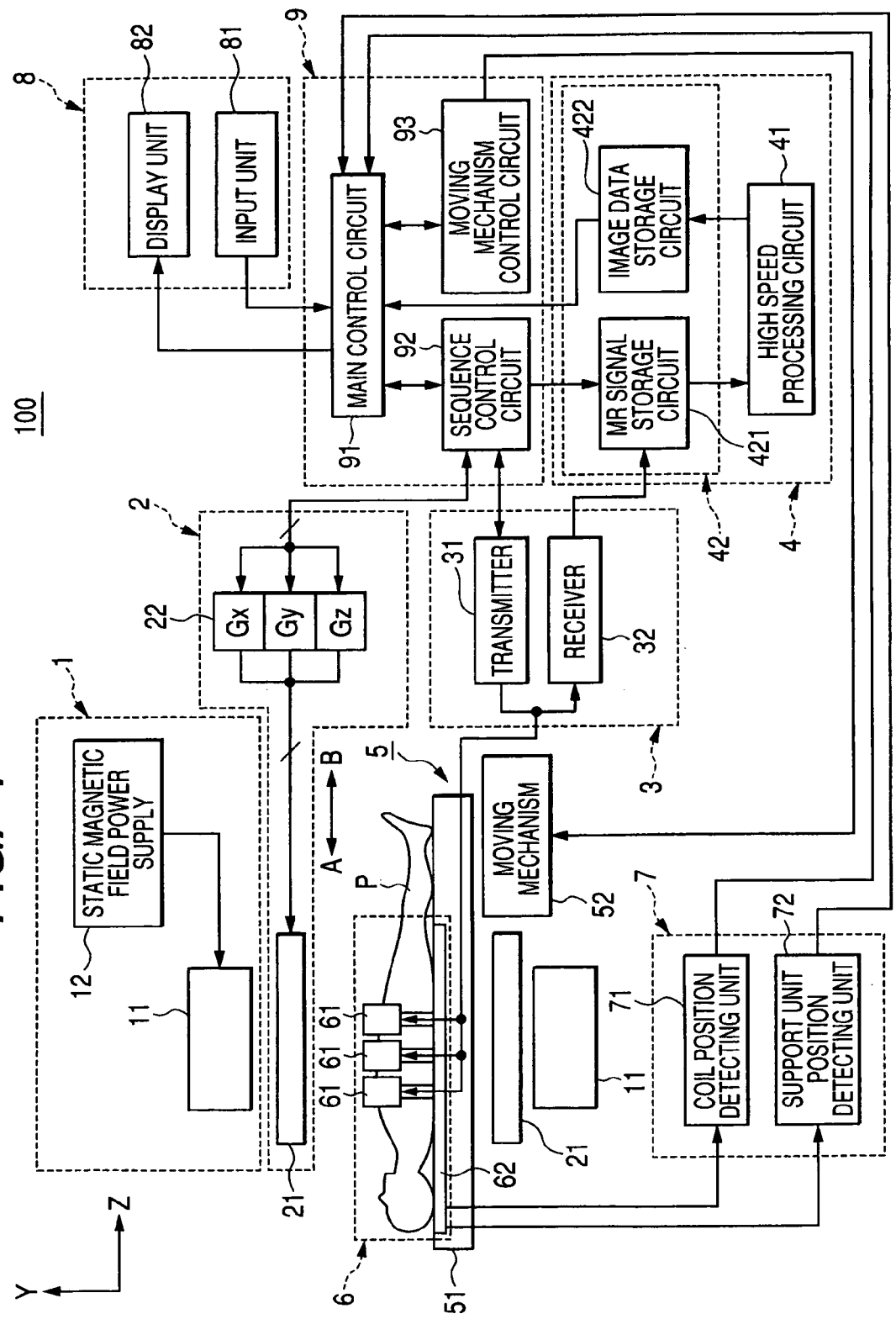
FIG. 1 is a block diagram showing an MRI apparatus according to an embodiment of this invention.

FIG. 1 is a block diagram showing an MRI apparatus 100 according to an embodiment of this invention.

The MRI apparatus 100 includes a static magnetic field generating unit 1, a gradient magnetic field generating unit 2, a transmitting and receiving unit 3, an operating and storing unit 4, a bed unit 5, a RF coil unit 6, a position detecting unit 7, a user interface unit 8, and a control unit 9.

The static magnetic field generating unit 1 includes a main magnet 11 and a static magnetic field power supply 12. A superconducting magnet is used as the main magnet 11. The static magnetic field power supply 12 supplies an electric current to the main magnet 11. The main magnet 11 forms a strong static magnetic field.

The gradient magnetic field generating unit 2 includes a gradient magnetic field coil 21 and a gradient magnetic field power supply 22. The gradient magnetic field coil 21 forms gradient magnetic fields in X, Y, and Z directions perpendicular to each other. The gradient magnetic field power supply 22 supplies an electric current to the gradient magnetic field coil 21. The gradient magnetic field coil 21 causes the gradient magnetic fields to overlap the static magnetic field. The gradient magnetic field power supply 22 is supplied with a control signal by the control unit 9, thereby, an electric current supplied to the gradient magnetic field coil 21 is changed on the basis of the control signal. Therefore, the gradient magnetic field generating unit 2 appropriately forms a gradient magnetic field for arbitrarily encoding a static magnetic field space. That is, by changing a pulse current supplied from the gradient magnetic field power supply 22 to X axial, Y axial, and Z axial gradient magnetic field coils 21 on the basis of the above gradient magnetic field control signal, the gradient magnetic fields in the X, Y, Z axes are combined. Further, a gradient magnetic field for selecting slices perpendicular to each other, a gradient magnetic field for phase encoding, and a gradient magnetic field for reading (frequency encoding) are set in arbitrary directions.

Further, the main magnet 11 and the gradient magnetic field coil 21 are received in a gantry having a cavity. Therefore, the center of the static magnetic field is positioned within the cavity.

The transmitting and receiving unit 3 includes a transmitter 31 and a receiver 32. The transmitter 31 includes a reference signal generator, a modulator, and a power amplifier. The transmitter 31 modulates a reference signal having a frequency same as a magnetic resonance frequency (ramoa frequency) determined depending on the strength of the static magnetic field into a selective excitation waveform to obtain a high frequency transmitting signal. The transmitter 31 supplies the obtained transmitting signal to the RF coil unit 6. The receiver 32 performs an intermediate frequency transforming process, a phase detecting process, and filtering process on the RF signal output from the RF coil unit 6, and then performs A/D conversion. When the MR signals are two MR signals whose difference of phases is 90 degree, obtained by a QD type volume coil, the receiver 32 further includes a 90 degree phase shifter for matching the phases.

The operating and storing unit 4 includes a high speed processing circuit 41 and a storage circuit 42. The storage circuit 42 includes an MR signal storage circuit 421 and an image data storage circuit 422. The MR signal storage circuit 421 stores an MR signal digitized by the receiver 32. The image data storage circuit 422 stores image data generated by the high speed processing circuit 41. The high speed processing circuit 41 performs a reconstructing process by performing a two dimensional Fourier transformation on the MR signal stored in the MR signal storage circuit 421 to generate image data in a real space.

The bed unit 5 includes a top panel 51 and a moving mechanism 52. The shape of the top panel 51 is a thin elongated shape. The top panel 51 is indicated by a base of a bed so as to be slidable in a longitudinal direction thereof (the solid line AB direction in FIG. 1). The patient P is disposed on a top surface of the top plate 51 so that the body axis direction of the patient substantially agrees with the longitudinal direction of the top plate. Therefore, the top panel 51 transfers the patient P in the body axis direction. The top panel 51 arbitrarily sets an imaging position of the patient P by sending the patient P from the outside of the static magnetic field to the inside of the static magnetic field and changing the position of the patient P with respect to the static magnetic field. The moving mechanism 52 moves the top plate 51 in the longitudinal direction thereof.

The RF coil unit 6 includes RF coils 61 and a support unit 62. The RF coils 61 transmit RF pulses on the basis of the transmitting signal supplied from the transmitter 31. Further, the RF coils 61 detect an MR signal radiated from the patient P to transmit the MR signal to the receiver 32. The support unit 62 is attached to the top plate 51, and supports the RF coils 61 so as to be positioned above the top plate 51. The RF coils 61 are detachable from the support unit 62. Further, the support unit 62 is slidable in the longitudinal direction of the top panel 51.

The position detecting unit 7 includes a coil position detecting unit 71 and a support unit position detecting unit 72. The coil position detector 71 detects a position in which the RF coils 61 are disposed. The support unit position detecting unit 72 detects a position of the support unit 62.

The user interface unit 8 includes an input unit 81 and a display unit 82. The input unit 81 includes various input devices such as switches, a keyboard, a mouse, etc. provided on an operating table. The input unit 81 obtains information or instructions input by the operator. Examples of the information obtained by the input unit 81 are various information concerning the patient P, or information concerning imaging conditions such as an imaging method and a pulse sequence or a display condition. Further, examples of the instructions obtained by the input unit 81 are an instruction for starting the imaging process, and an instruction concerning the movement of the top panel 51. The display unit 82 includes a video memory, a converting circuit, and a monitor. When the image data stored in the image data storage circuit 422 is supplied to the display unit 82 by the control unit 9, the display unit 82 stores the image data in the video memory. Therefore, the image data and supplementary information including the information concerning the patient input from the input unit 81 are combined in the video memory. The image data combined in the video memory is converted into a video format and D/A converted by the converting circuit to be an image signal, and then supplied to the monitor. The monitor displays images represented by the image signal. As the monitor, a CRT (cathode ray tube) or an LCD (liquid crystal display) can be used.

The control unit 9 includes a main control circuit 91, a sequence control circuit 92, and a moving mechanism control circuit 93. The main control unit 91 includes a CPU and a storage circuit and collectively controls the MRI apparatus 100. In the storage circuit of the main control circuit 91, the information concerning the imaging condition or the display condition that is obtained by the input unit 81 is stored. The CPU of the main control circuit 91 supplies pulse sequence information to the sequence control circuit 92 on the basis of the information stored in the storage circuit. Examples of the pulse sequence information are information concerning the intensity of current supplied to the gradient magnetic field coil 21, the level of the transmitting signal, the amount of applying time, the applying timing, etc. The sequence control circuit 92 includes a CPU and a storage circuit and controls the gradient magnetic field power supply 22, the transmitter 31, and the receiver 32 on the basis of the pulse sequence information. The moving mechanism control circuit 93 includes a CPU and a storage circuit, generates a control signal for moving the top plate 51, and supplies the control signal to the moving mechanism 52.

Figure 2:
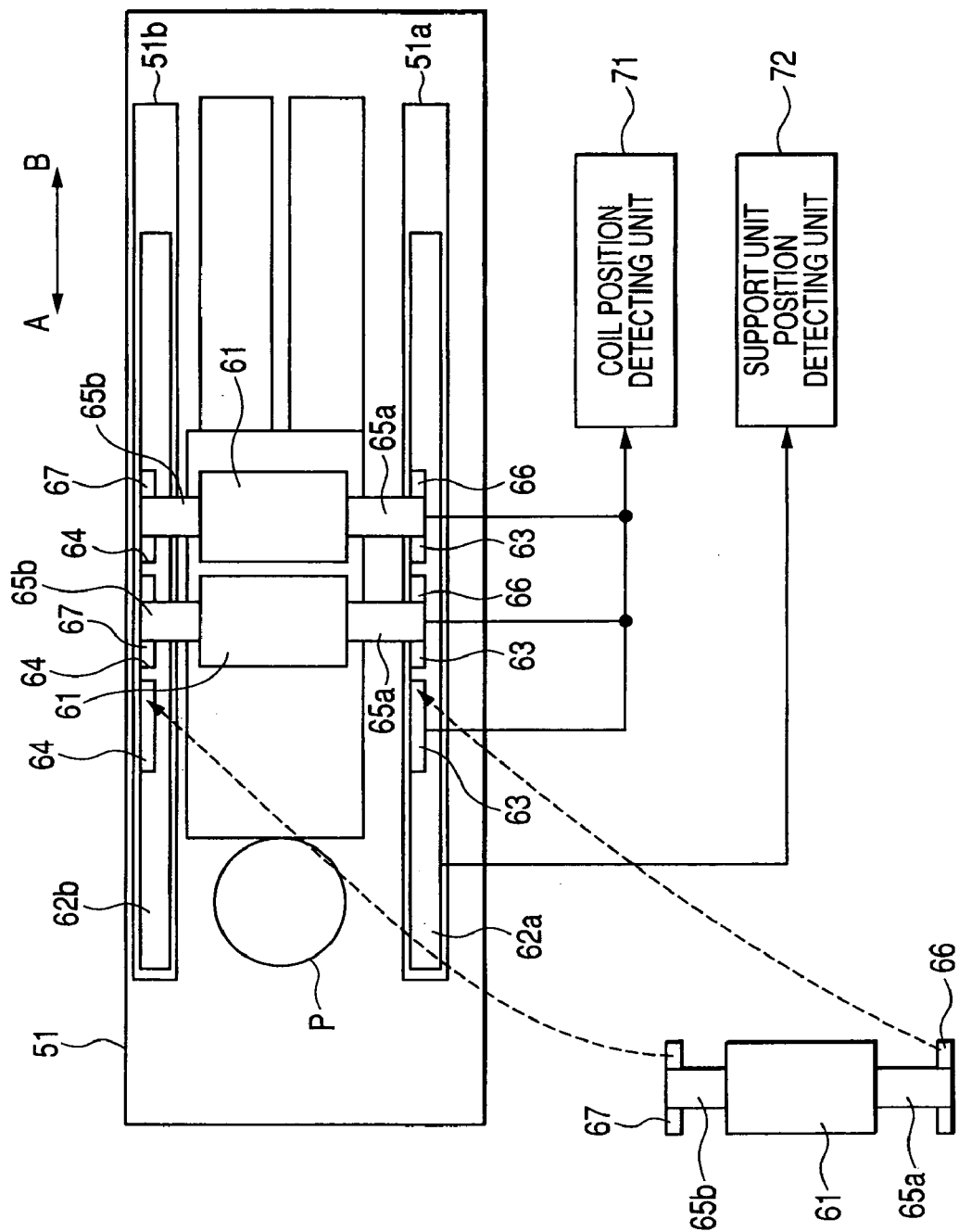
FIG. 2 is a diagram showing a configuration of a substantial parts of the MRI apparatus according to an embodiment of this invention.

FIGS. 2 and 3 are diagrams showing detailed configurations of the RF coil unit 6.

As shown in FIG. 2, the support unit 62 includes a first support 62a and a second support 62b. The first and second supports 62a and 62b are guided by grooves 51a and 51b formed in the top plate 51 in the longitudinal direction thereof to be slidable in the longitudinal direction of the top plate 51. The grooves 51a and 51b are separated from each other in a direction perpendicular to the longitudinal direction of the top plate 51 with a distance enough to dispose the patient P and disposed in parallel with each other.

Further, as shown in FIGS. 2 and 3, the RF coil unit 6 further includes sockets 63, concave portions 64, connecting members 65a and 65b, plugs 66, and fitting members 67 in addition to the RF coils 61 and the support unit 62.

The plurality of sockets 63 are provided in the first support 62a so as to be arranged along the longitudinal direction of the top plate 51. The same number of concave portions 64 as the sockets 63 is provided in the first support 62a so as to be arranged to form a pair with the corresponding socket 63. Further, in this embodiment, even though three pairs of socket 63 and concave portion 64 are provided, the number of pairs may be arbitrarily changed.

The coupling members 65a and 65b are flexible belt shaped members. First ends of the connecting members 65a are attached to the RF coils 61 and second ends are attached to the plugs 66. First ends of the connecting members 65b are attached to the RF coils 61 and second ends are attached to the fitting members 67.

The plugs 66 can be inserted/removed into/from the sockets 63. When the plugs 66 are inserted into the sockets 63, electrical wiring is formed such that the RF coils 61 are electrically connected to the transmitter 31 and the receiver 32. Further, when the plugs 66 are mounted in the sockets 63, the plugs 66 are fitted into the sockets 63. Therefore, the sockets 63 and the plugs 66 configure a connector for electrically connecting and mechanically fixing the RF coils 61 to the main body of the MRI apparatus.

The fitting members 67 can be inserted/removed into/from the concave portions 64. When the fitting members 67 are inserted into the concave portions 64, the fitting members 67 are fitted to the concave portions 64. Therefore, the concave portions 64 and the fitting members 67 form a fixing unit for mechanically fixing the RF coils 61 to the main body of the MRI apparatus.

By inserting the plugs 66 into the sockets 63, and inserting the fitting members 67 into the concave portions 64, one of RF coils 61 is assembled with one pair of the socket 63 and concave portion 64. Since the plugs 66 and the fitting members 67 are fitted to the sockets 63 and the concave portions 64, respectively, the position of the RF coils 61 assembled relative to the first and second supports 62a and 62b is defined in the longitudinal direction of the top plate 51. That is, it is possible to arbitrarily mount the RF coils 61 in three mounting positions formed by the pairs of the sockets 63 and the concave portions 64.

The sockets 63 have a function for transmitting a first detection signal indicating whether the plugs 66 are inserted into the sockets 63 or not to the coil position detecting unit 71. This function can be realized by a configuration that provides electrical contacts that is closed when the plugs 66 are inserted into the sockets 63 in the sockets 63 and outputs detecting signals including ID information of the sockets 63 when the electrical contacts are closed.

The first support 62a has a function for transmitting a second detecting signal indicating the relative position to the top plate 51 to the support unit position detecting unit 72. This function can be realized by using a known position detecting sensor.

The operation of the MRI apparatus configured as mentioned above will be described.

In a state where the top plate 51 is drawn from the gantry and none of RF coils 61 are mounted, the patient P can be easily disposed on the top plate 51. After the patient P is disposed on the top plate 51, the operator mounts an arbitrary number of RF coils 61 corresponding to a portion of the patient P to be imaged. In this case, after inserting the plugs 66 into the sockets 63, it is possible to minutely adjust the relative position relationship between the RF coils 61 and the patient P by slightly moving the first supports 62a. When the first support 62a can be moved by a distance that is half of the arrangement pitch of the sockets 63, the degree of freedom for minute adjustment is high. Next, by slightly moving the second support 62b so that the corresponding concave portion 64 faces the socket 63 to which the plug 66 has been inserted, the fitting member 67 can be easily inserted into the concave portion 64. It is further possible to insert the plug 66 into the socket 63 after inserting the fitting member 67 into the concave portion 64.

A first detecting signal is output from the socket 63 into which the plug 66 is inserted so as to mount the RF coils 61 to the coil position detecting unit 71. The coil position detecting unit 71 detects the mounting position in which the RF coils 61 are mounted on the basis of the ID information included in the first detecting signal input. The coil position detecting unit 71 transmits the coil position information indicating the detected result to the main control circuit 91.

In the meantime, the support unit position detecting unit 72 detects the position of the support 62a on the basis of a second detecting signal output from the first support 62a. The support unit position detecting unit 72 transmits the support unit position information indicating the detected result to the main control circuit 91.

The main control circuit 91 determines the relative position of the RF coils 61 to be mounted with respect to the top plate 51 on the basis of the coil position information and the support unit position information. Therefore, when the imaging is performed while moving the top plate 51, the main control circuit 91 controls so as to use a proper RF coil 61 for imaging on the basis of the position of the top plate 51 and the relative position of the RF coils 61 to be mounted with respect to the top plate 51. The proper RF coil 61 is generally a RF coil 61 that is closest to the center of the static magnetic field.

According to the above embodiment, it is possible to arbitrarily mount each of the RF coils 61 in a plurality of mounting positions formed by a pair of the socket 63 and the concave portion 64. Therefore, the setting position of the mounted RF coil 61 is detected based on one socket 63 among the plurality of sockets 63 to which the plug 66 is inserted in order to mount the RF coil 61. In the MRI apparatus according to this embodiment, it is possible to exactly catch the setting position of the RF coil 61 that is arbitrarily mounted. Therefore, the proper RF coil 61 is selectively used to perform imaging in consideration of the setting position of the RF coil 61. As a result, it is possible to reduce the number of processes of reconstructing. It is further possible to effectively perform imaging that prevents the unnecessary images from being obtained, without increasing the burden of the operator.

This embodiment may be modified as follows.

The structure for positioning the RF coils 61 is not limited to the above embodiment, and it is possible to change the above structure into various other types of positioning structure. The socket and the plug may be provided instead of the concave portion 64 and the fitting member 67. For example, it is preferable that the sockets 63 and the plugs 66 or the concave portions 64 and the fitting members 67 are not provided. When the sockets 63 and the plugs 66 are not provided, the RF coils 61 are electrically connected to the transmitting and receiving unit 3 through a separate cable, etc. The sockets 63 are preferably attached to the RF coils 61, and the plugs 66 are preferably attached to the top plate 51. Further, the concave portions 64 are preferably attached to the RF coils 61, and the fitting members 67 are preferably attached to the top plate 51.

Without providing the first and second supports 62a and 62b, the socket 63 and the concave portions 64 may be directly provided on the top panel 51. The first and second supports 62a and 62b may be fixed to the top plate 51. In the above cases, the support unit position detecting unit 72 can be omitted. In the main control circuit 91, it is further possible to determine the relative position of the RF coil 61 mounted with respect to the top plate 51 only on the basis of the information concerning the coil position.

The function of outputting the first detecting signal to the coil position detecting unit 71 can be provided to the concave portion 64, the first support 62a, the second support 62b, or the top plate 51.

The first detecting signals are simultaneously input to the coil position detecting unit 71, and thus the position of the RF coils 61 can be detected by the coil position detecting unit 71 on the basis of a first detecting signal that is input thereto. In this case, the ID information is not needed to be included in the first detecting signals.

The RF coils 61 have a function of outputting ID information for identifying the RF coils 61 and ID information for identifying the type of the RF coils 61 and the ID information may be included in the first detecting signals. In this case, it is possible to mount plural types of RF coils 61 whose relative positions of coil elements with respect to the plug 66 are different from each other, and to exactly detect the position of the coil element in the RF coils 61 mounted in consideration of the difference in the relative positions with respect to the plug 66. Furthermore, when the RF coils 61 having a plurality of coil elements mounted therein is inserted, the individual positions of the coil elements can be detected.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus, comprising:
   a top plate on which an patient to be imaged is disposed;
   a plurality of positioning units that determines setting positions of RF coils detachable from the top plate in a plurality of different positions; and
   a detecting unit that detects the setting positions of the RF coils based on one of the positioning units that is used in order to determine the setting positions of the RF coils.

2. The magnetic resonance imaging apparatus according to claim 1,
   wherein the positioning units are at least one of first and second members which are fitted to each other for connecting the RF coil to the top plate electrically and mechanically and one of third and fourth members which are fitted to each other for fixing the RF coil to the top plate.

3. The magnetic resonance imaging apparatus according to claim 2,
   wherein one of the first and second members and one of the third and fourth members are arranged so as to face each other with a body axis of the patient disposed on the top plate interposed therebetween.

4. The magnetic resonance imaging apparatus according to claim 1, further comprising:
   a support unit that moves in a body axis direction of the patient with respect to the top plate,
   wherein the detecting unit detects the positions of the RF coils in consideration of the position of the support unit.

5. The magnetic resonance imaging apparatus according to claim 1, further comprising:
   the RF coil.

6. The magnetic resonance imaging apparatus according to claim 5,
   wherein each of the positioning units includes at least one of one of first and second members and one of third and fourth members, and
   a member for fitting the member that is included in the positioning unit among the first to fourth members to the RF coil is attached to the RF coil.

7. The magnetic resonance imaging apparatus according to claim 6,
   wherein at least one of the first to fourth members is attached to the RF coils through a belt shaped connecting member.

8. The magnetic resonance imaging apparatus according to claim 1, further comprising:
   a plurality of identical signal generating units corresponding to the plurality of positioning units,
   wherein the identical signal generating units that correspond to the positioning units used to determine the setting positions of the RF coils generate an identification signal for identifying the corresponding positioning unit, and
   the detecting unit determines which positioning unit is used to determine the setting positions of the RF coils, on the basis of the identification signal generated by the identical signal generating unit.

9. The magnetic resonance imaging apparatus according to claim 1, further comprising:
   a plurality of identical signal generating units corresponding to the plurality of positioning units,
   wherein the identical signal generating units that correspond to the positioning units used to determine the setting positions of the RF coils generate an identification signal for identifying the corresponding positioning unit and the RF coil whose setting position is determined by the corresponding positioning unit, and
   the detecting unit identifies the RF coil and the positioning unit that is used to determine the setting positions of the RF coils, on the basis of the identification signal generated by the identical signal generating unit, and detects a position of a coil element provided in the RF coil on the basis of the identification.

10. The magnetic resonance imaging apparatus according to claim 9,
    wherein when a plurality of coil elements are provided in the RF coil, the detecting unit detects the individual positions of the coil elements.

11. A magnetic resonance imaging apparatus, comprising:
a bed having a top plate on which an patient is disposed and sliding the top plate in a first direction so as to move the patient in a body axis direction;
an applying unit that applies a gradient magnetic field and a RF pulse to the patient who is sent in a static magnetic field by the bed;
at least one RF coil that detects a magnetic resonance signal radiated from the patient by applying the gradient magnetic field and the RF pulse; and
a plurality of positioning units that determines setting positions of RF coils in a plurality of different positions.

12. The magnetic resonance imaging apparatus according to claim 11,
wherein each of the positioning units includes at least one of one of first and second members which are fitted to each other for connecting the RF coil to the top plate electrically and mechanically and one of third and fourth members which are fitted to each other for fixing the RF coil to the top plate, and
a member for fitting the member that is included in the positioning unit among the first to fourth members to the RF coil is attached to the RF coil.

13. The magnetic resonance imaging apparatus according to claim 12,
wherein each of the positioning units includes one of the first and second members and one of the third and fourth members, and
the first or second member and the third or fourth member which are included in the positioning unit are arranged substantially at the same pitch.

14. The magnetic resonance imaging apparatus according to claim 12,
wherein one of the first and second members and one of the third and fourth members are arranged so as to face each other with a body axis of the patient disposed on the top plate interposed therebetween.

15. The magnetic resonance imaging apparatus according to claim 11, further comprising:
a detecting unit that detects the setting positions of the RF coils based on one of the positioning units that is used to determine the setting positions of RF coils.

16. The magnetic resonance imaging apparatus according to claim 15, further comprising:
a support unit that moves in an body axis direction of the patient with respect to the top plate,
wherein the detecting unit detects the positions of the RF coils in consideration of the position of the support unit.

17. The magnetic resonance imaging apparatus according to claim 12,
wherein at least one of the first to fourth members is attached to the RF coils through a belt shaped connecting member.

18. The magnetic resonance imaging apparatus according to claim 11, further comprising:
a plurality of generating units corresponding to the plurality of positioning units,
wherein the generating units that correspond to the positioning units used to determine the setting positions of the RF coils generate an identification signal for identifying the corresponding positioning unit, and
the detecting unit determines which positioning unit is used to determine the setting positions of the RF coils, on the basis of the identification signal generated by the generating unit.

19. The magnetic resonance imaging apparatus according to claim 11, further comprising:
a plurality of generating units corresponding to the plurality of positioning units,
wherein the generating units that correspond to the positioning units used to determine the setting positions of the RF coils generate an identification signal for identifying the corresponding positioning unit and the RF coil whose setting position is determined by the corresponding positioning unit, and
the detecting unit identifies the RF coil and the positioning unit that is used to determine the setting positions of the RF coils, on the basis of the identification signal generated by the generating unit, and detects a position of a coil element provided in the RF coil on the basis of the identification.

20. The magnetic resonance imaging apparatus according to claim 19,
wherein when a plurality of coil elements are provided in the RF coil, the detecting unit detects the individual positions of the coil elements.

21. A magnetic resonance imaging apparatus, comprising:
a bed having a top plate on which an patient is disposed and sliding the top plate in a first direction so as to move the patient in a body axis direction;
an applying unit that applies a gradient magnetic field and a RF pulse to the patient who is sent in a static magnetic field by the bed;
at least one RF coil that detects a magnetic resonance signal radiated from the patient by applying the gradient magnetic field and the RF pulse;
a plurality of positioning units that determines setting positions of RF coils in a plurality of different positions; and
a detecting unit that detects the setting positions of the RF coils based on one of the positioning units that is used in order to determine the setting positions of the RF coils.

22. A method of detecting setting positions of RF coils of a magnetic resonance imaging apparatus which includes a top plate on which an patient to be imaged is disposed and a plurality of positioning units that determines the setting positions of the RF coils detachable from the top plate in a plurality of different positions, comprising:
identifying one of the plurality of positioning units that is used to determine the setting positions of the RF coils; and
detecting the setting positions of the RF coils on the basis of the identified positioning unit.

* * * * *